United States Patent [19]
Lin

[11] Patent Number: 5,668,039
[45] Date of Patent: Sep. 16, 1997

[54] METHOD FOR FORMING CROWN-SHAPE CAPACITOR NODE WITH TAPERED ETCHING

[75] Inventor: Yeh-Sen Lin, Tao-Yuan, Taiwan

[73] Assignee: Vanguard International Semiconductor Corp., Hsinchu, Taiwan

[21] Appl. No.: 759,233

[22] Filed: Dec. 5, 1996

[51] Int. Cl.[6] .................................................. H01L 21/8242
[52] U.S. Cl. ........................... 438/387; 438/396; 438/397
[58] Field of Search ................................ 437/47, 52, 60, 437/919

[56] References Cited

U.S. PATENT DOCUMENTS

| | | | |
|---|---|---|---|
| 5,443,993 | 8/1995 | Park et al. | 437/60 |
| 5,444,005 | 8/1995 | Kim et al. | 437/52 |
| 5,550,077 | 8/1996 | Tseng et al. | 437/52 |

Primary Examiner—Jey Tsai
Attorney, Agent, or Firm—Christensen O'Connor Johnson & Kindness, PLLC

[57] ABSTRACT

A crown-shape capacitor node is formed using a tapered etching process to increase the capacitance of the capacitor. A doped polysilicon layer is deposited over a substrate from which the capacitor node is formed. A tapered trench is formed in a doped polysilicon layer using a mask layer. The mask layer is removed and a dielectric layer is deposited over the doped polysilicon layer and filling the tapered trench. The dielectric layer is then etched back, leaving residual portions in the tapered trench. The doped polysilicon layer is then etched using the dielectric material in the tapered trench as an etching mask. The resulting capacitor node has tapered sidewalls, which increases the surface area of the capacitor node, thereby increasing the capacitor's capacitance. The mask layer can be formed so that the tapered etching process forms the capacitor node with either tapered exterior sidewalls or a tapered trench.

25 Claims, 6 Drawing Sheets

5,668,039

METHOD FOR FORMING CROWN-SHAPE CAPACITOR NODE WITH TAPERED ETCHING

FIELD OF THE INVENTION

The present invention relates to methods for forming semiconductor integrated circuits and, more particularly, to methods for forming crown-shape capacitor nodes.

BACKGROUND

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering signal to noise ratio and undesirable signal problems. The desired higher level of integration with reliable operation, can be achieved by making DRAM storage capacitors with the same storage capacitance on a greatly reduced cell area.

Efforts to maintain or increase the storage capacitance in memory cells with greater packing densities have included the use of a stacked capacitor design in which the capacitor cell uses the space over the device area for the capacitor plates. For example, a three-dimensional stacked capacitor is disclosed in U.S. Pat. No. 5,053,351. The storage node plate of this capacitor has an E-shaped cross-section. In another example, a stack capacitor with ladder storage node is disclosed in U.S. Pat. No. 5,451,537. The top surface of the bottom electrode is fabricated a step-like structure. These complex capacitor shapes increase the surface area of the capacitor, resulting in a higher storage capacitance. However, complex capacitor shapes tend to be complex to fabricate and may have reduced structural integrity. Accordingly, there is a need for capacitor node with high surface area that is simple to manufacture.

SUMMARY

In accordance with the present invention, a method for forming crown-shape capacitor node with tapered etching in DRAM cell is disclosed. In one embodiment, the method includes forming a first dielectric layer on a semiconductor substrate. Contact holes are formed in the first dielectric layer and then a first conductive layer is formed on the first dielectric layer and completely filling the contact holes. The a patterned photoresist is formed on first conductive layer in a conventional method, forming masks over and extending beyond the contact holes. Afterward, the first conductive layer is etched using a two-step etching process to form the bottom storage node of the capacitor. The first etching process is a direct anisotropic etching process and the second etching process is a tapered etching process. The tapered etching process is performed to form tapered trenches between the contact holes, forming a capacitor storage node for each contact hole. The tapered trenches also causes the storage nodes to have a tapered exterior profile. This tapered profile advantageously increases the node's surface area.

A second dielectric layer is formed over the first conductive layer and the first dielectric layer, completely filling the tapered trenches between storage nodes. Then, the upper portion of the second dielectric layer is removed until the top surface of the first conductive layer exposed, leaving residual portions of the second dielectric layer in the tapered trenches. The first conductive layer unprotected by the second dielectric layer is then etched to certain depth forming an approximately rectangular trench in the capacitor node. Finally, the second dielectric layer left in the taped trenches is removed to form a crown-shape capacitor node.

In another embodiment, a first dielectric layer and a first conductive layer is formed on a semiconductor substrate, with the first conductive layer filling contact holes as describe above. Then a first photoresist layer is formed on the first conductive layer, leaving portions of the first conductive layer uncovered, located over the contact holes. Afterward, the first conductive layer is etched in two-step etching process. The first etching process is a direct anisotropic etching process and the second etching process is a tapered etching process. The tapered etching process is controlled to remove a certain depth of the first conductive layer, forming tapered trenches in the first conductive layer but not exposing the first conductive layer. The tapered trenches are aligned with the contact holes.

A second dielectric layer is formed on the first conductive layer and filling the tapered trenches. Then, the upper portion of the second dielectric layer is removed until the top surface of the first conductive layer between the tapered trenches is exposed, leaving residual portions of the second dielectric layer in the tapered trenches. Then portions of the first conductive layer left unprotected by the second dielectric layer are removed until the top surface of the first dielectric is exposed, separating adjacent capacitor nodes. Finally, the residual portions of the second dielectric layer are removed. With the tapered trench in each of the capacitor nodes, crown-shape capacitor nodes with increased storage node surface area are achieved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
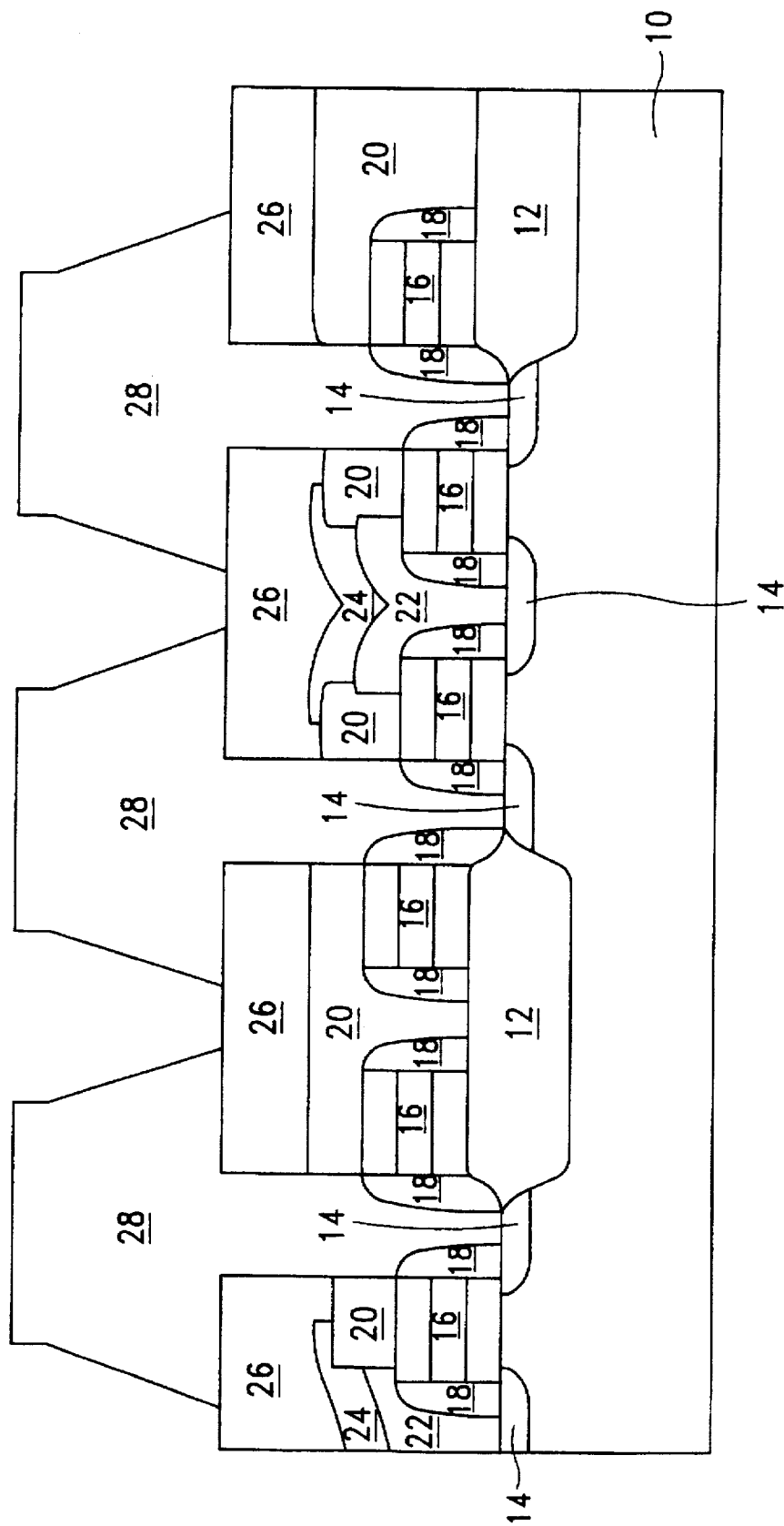
FIG. 1 is a cross-sectional view of a semiconductor wafer illustrative of forming polysilicon storage nodes on a substrate, in accordance with one embodiment of the present invention.

Referring to FIG. 1, a single crystal substrate 10 with a <100> crystallographic orientation is provided. In this embodiment adapted for DRAM fabrication, metal-oxide-semiconductor field effect transistors (MOSFETs), word lines and bit lines are formed in and on the substrate 10 in any suitable manner. In one embodiment, the word lines and bit lines are formed as follows.

Thick field oxide (FOX) regions 12 are formed to provide isolation between devices on the substrate 10. The FOX regions 12 is created in a conventional manner. In this embodiment, the FOX regions 12 are formed via standard photolithography and dry etching steps to define the FOX regions 12 using a silicon nitride layer formed on the substrate. The exposed portions of the substrate are then subjected to thermal oxidation in an oxygen-steam environment to grow the FOX region 12 to a thickness of about 4000–6000 angstroms. The silicon nitride layer is then removed. Next, a silicon dioxide layer is created on the top of surface of the substrate 10 to serve as the gate oxide for subsequently formed metal oxide silicon field effect transistors. In this embodiment, the silicon dioxide layer is formed by using an oxygen-steam ambient, at a temperature of about 850°–1000° C. Alternatively, the oxide layer may be formed using any suitable oxide chemical compositions and procedures. In this embodiment, the silicon dioxide layer is formed to a thickness of approximately 100 angstroms.

A first polysilicon layer is then formed over the FOX regions 12 and the silicon dioxide layer using a low pressure chemical vapor deposition (LPCVD) process. The first polysilicon layer is doped in order to forth a conductive gate for the MOSFET structure. In this embodiment, the first polysilicon layer has a thickness of about 500–2000 angstroms and is doped with phosphorus dopants at a concentration of about $10^{20}$–$10^{21}$ ions/cm$^2$. A tungsten silicide layer is formed on the first polysilicon layer to improve interconnection between the gate polysilicon and subsequently formed metal interconnects. Next, standard photolithography and etching process are performed to form gate structures 16 and word lines. Sidewall spacers 18 are subsequently formed on the sidewalls of the first polysilicon layer. Thereafter, active region 14 (i.e., MOSEFET's source and drain) are formed, using well-known processes to implant appropriate impurities in those regions and activate the impurities. In view of this disclosure, those skilled in the art of DRAM fabrication can modify this embodiment to form lightly doped drain (LDD) structures, without undue experimentation.

Then a first dielectric layer 20 is deposited on the gate structures 16 and the substrate 10 for isolation. The first dielectric layer 20, in the preferred embodiment, is composed of oxide such as TEOS and BPSG formed using a standard chemical vapor deposition process to a thickness of about 2000–4000 angstroms. The first dielectric layer 20 is patterned and etched to form contact windows over the source/drain regions. A metal layer 22 is then deposited on the first dielectric layer 20 and the exposed portion of the source/drain regions 14. The metal layer 22 is then patterned and etched to form a bit line. A nitride layer 24 is then formed on the bit line and the first dielectric layer using a standard chemical vapor deposition process. This nitride layer 24 is preferably about 500 angstroms, but any thickness in the range of 300 to 1000 angstroms can be used. The nitride layer 24 provides isolation for the transistor and bit line structures and also serves as an etching stopper in subsequent processing.

A second dielectric layer 26 is subsequently formed on the nitride layer 24. The second dielectric layer 26 can be formed of any suitable material such as, for example, silicon dioxide. Preferably, the second dielectric layer 26 is formed using a conventional chemical vapor deposition process. The thickness of the second dielectric layer 26 is about 2000 angstroms, but can be any suitable thickness in the range of 2000 to 4000 angstroms. The second dielectric layer 26 is then planarized to improve the topography for the next processing step.

Standard processes are then used to form and pattern a photoresist layer (not shown) on the second dielectric layer 26 to define contact holes over selected source/drain regions 14. The photoresist layer leaves uncovered the contact holes, which are then etched through the second dielectric layer 26, the nitride layer 24 and the first dielectric layer 20 to expose a portion of the selected source/drain regions 14. In this embodiment, a standard patterning and etching process is perforated to form the contact hole to have the minimum width supported by the photolithography process. The planarization process performed on the second dielectric layer 26 facilitates the formation of the minimum width contact hole.

A second polysilicon layer 28 is then formed on the second dielectric layer 26 and in the contact hole. The second polysilicon layer 28 is formed using a conventional LPCVD process to completely fill the contact holes. The thickness of the second polysilicon layer 28 on the top surface of the second dielectric layer 28 is about 4000–10000 angstroms. The second polysilicon layer 28 doped with phosphorus dopants with a concentration of about $10^{20}$–$10^{21}$ ions/cm$^2$ to increase conductivity. Any suitable method may be used to doped the polysilicon such as, for example, in-situ doping.

Next, the second polysilicon layer 28 is patterned. In this embodiment, conventional photolithography processes are performed to create etching masks (not shown) over the contact holes. In the preferred embodiment, the masks are about 0.3–0.8 μm in width and centered over the contact holes. A two-step etching process is then performed to define the patterned second polysilicon 28 so as to form trenches having tapered profiles. The first step of the etching process is a direct anisotropic etching process. This first etching step, using a time control process, forms a shallow trench with an approximately rectangular profile between the contact holes. In this embodiment, this rectangular trench is about 500–2000 angstroms deep. This direct etching can be any standard anisotropic etching process. For example, using $Cl_2$, HBr, and $O_2$ etchant gases in a plasma etch process, an anisotropic etch is achieved using a $Cl_2$ gas flow of about 70 sccm, a HBr gas flow of about 60 sccm, and a $O_2$ gas flow of about 6 sccm, with an excitation power of about 550 W, and a pressure of about 250 mtorr.

The second step of the etching process is a tapered etching process. The tapered etching can be achieved by reducing the etching rate as the etch is performed by the reaction conditions (e.g., a decrease the gas flow of the reactive gases). In this embodiment, the tapered etching is performed by changing the reaction conditions to the following parameters: the $Cl_2$ gas flow is about 420 sccm; the HBr gas flow is about 50 sccm; the $O_2$ gas flow is about 3 sccm; the excitation power is about 300 W; and the pressure is about 525 mtorr. The second dielectric layer 26 is the end stop point of the tapered etching process. Thus, tapered trenches are formed through the polysilicon layer 28, forming polysilicon storage nodes with a tapered exterior profile. This tapered profile increases the surface area of the storage node, thereby increasing the capacitor's storage capacitance. The resulting structure is shown in FIG. 1.

Figure 2:
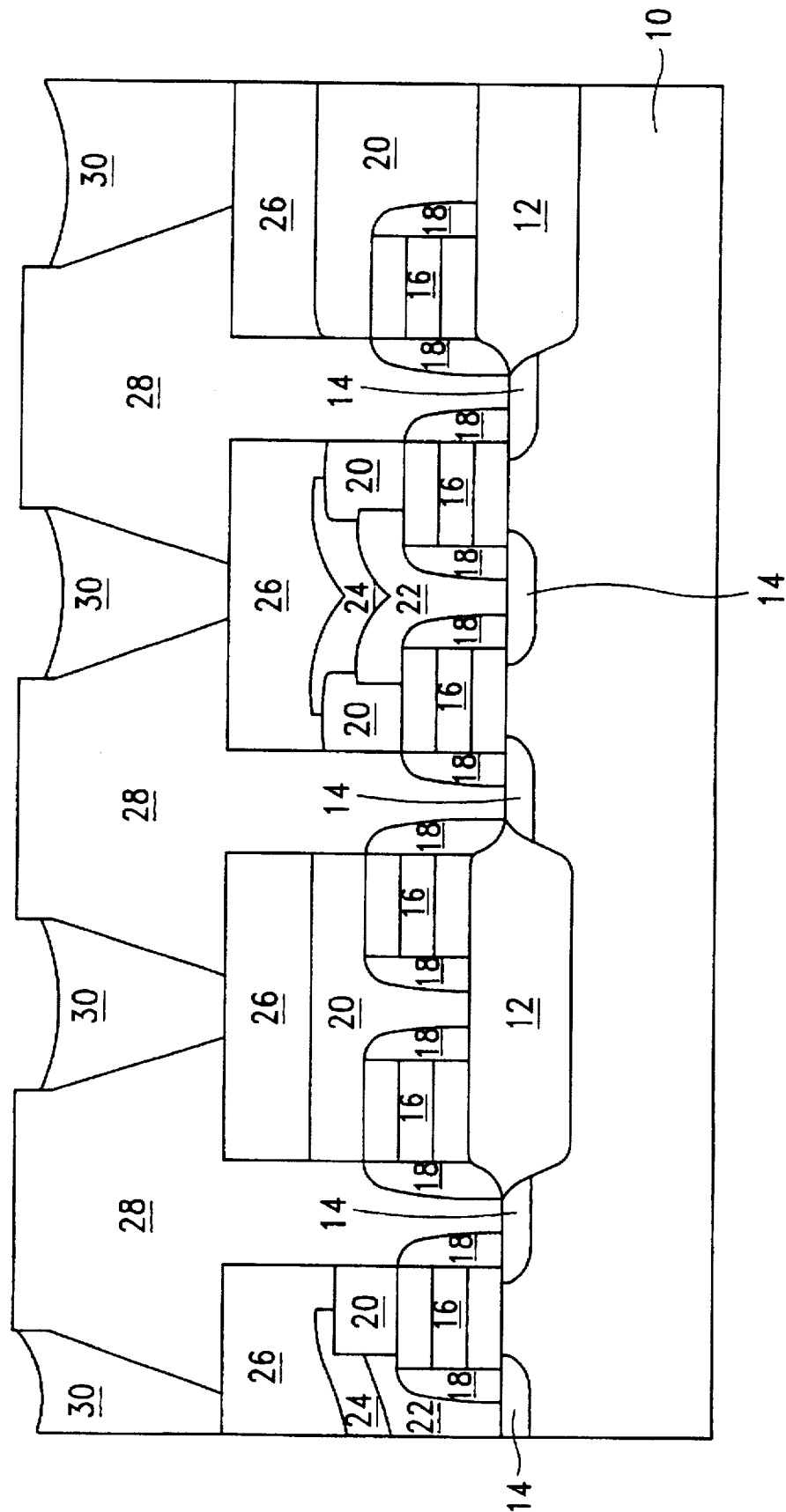
FIG. 2 is a cross-sectional view of a semiconductor wafer illustrative of forming a dielectric layer in trenches between storage nodes, in accordance with the embodiment of FIG. 1.

FIG. 2 shows a next stage of this embodiment of the process. A third dielectric layer 30 is formed on the polysilicon layer 28, completely filling the tapered trenches through the polysilicon layer 28. The third dielectric layer 30 can be made of any suitable dielectric material such as, for example, tetraethyl orthosilicate (TEOS) oxide, borophosphosilicate glass (BPSG), or spin on glass (SOG). The third dielectric layer 30 is deposited by a suitable CVD method to a thickness of about 4000–10000 angstroms. An etching back process is then performed to remove the upper portion of the third dielectric layer 30 so that the top surface of the second polysilicon layer 28 is exposed. As a result of this etching back process, residual portions of the third dielectric layer 30 remain in the tapered trenches. The etching back process can be any suitable etching process, such as dry etching.

Afterwards, a polysilicon etching process is performed to etch the second polysilicon layer 28, using the residual portions of the third dielectric layer 30 in the tapered trenches as an etching mask. Any suitable polysilicon etching process is performed to remove the second polysilicon layer 28 while leaving the residual dielectric layer 30 intact. In this embodiment, an anisotropic time mode controlled etching process is used to form trenches in the polysilicon layer 28 having a depth of about 2000–8000 angstroms. As a result of this etching process, each polysilicon storage node has an approximately rectangular, thereby achieving a crown-shape capacitor structure.

Figure 3:
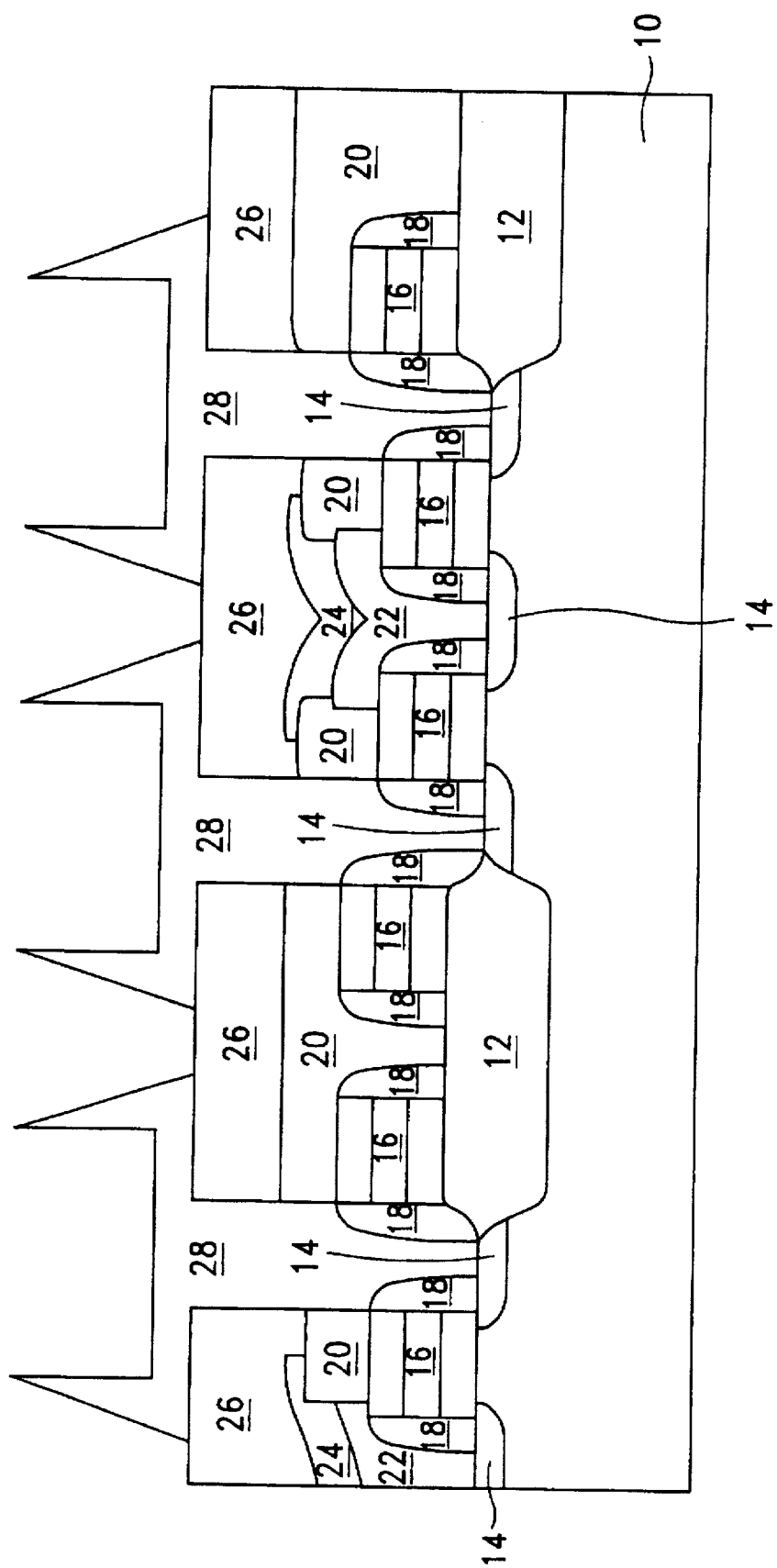
FIG. 3 is a cross-sectional view of a semiconductor wafer illustrative of etching trenches in the storage nodes, in accordance with the embodiment of FIG. 2.

Then, the residual portions of the third dielectric layer 30 are removed leaving the polysilicon storage nodes intact. Any suitable standard etching process such as, for example, wet etching or a dry etching processes. The second dielectric layer 26 serves as the end-point of this etching process. The etching process must have a relatively high selectivity ratio of the third dielectric layer 30 to the second dielectric layer 28 to prevent the second dielectric layer 30 from losing too much material in the periphery. The resulting structure is shown in FIG. 3. The capacitor is then completed by forming a capacitor dielectric (e.g., ONO) and upper storage node using any suitable conventional processes.

Figure 4:
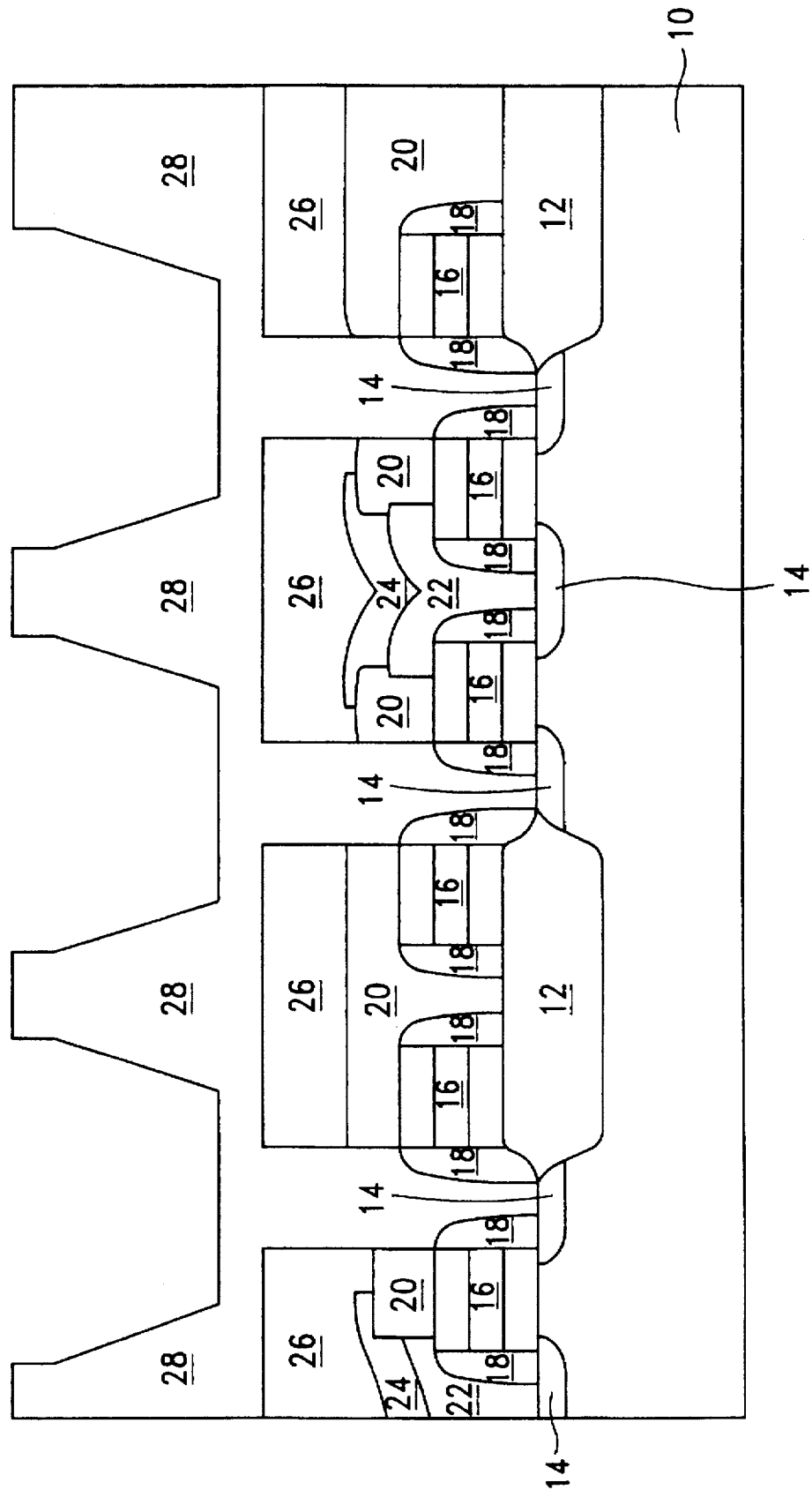
FIG. 4 is a cross-sectional view of a semiconductor wafer illustrative of forming and etching a conductive layer, in accordance with another embodiment of the present invention.
Figure 5:
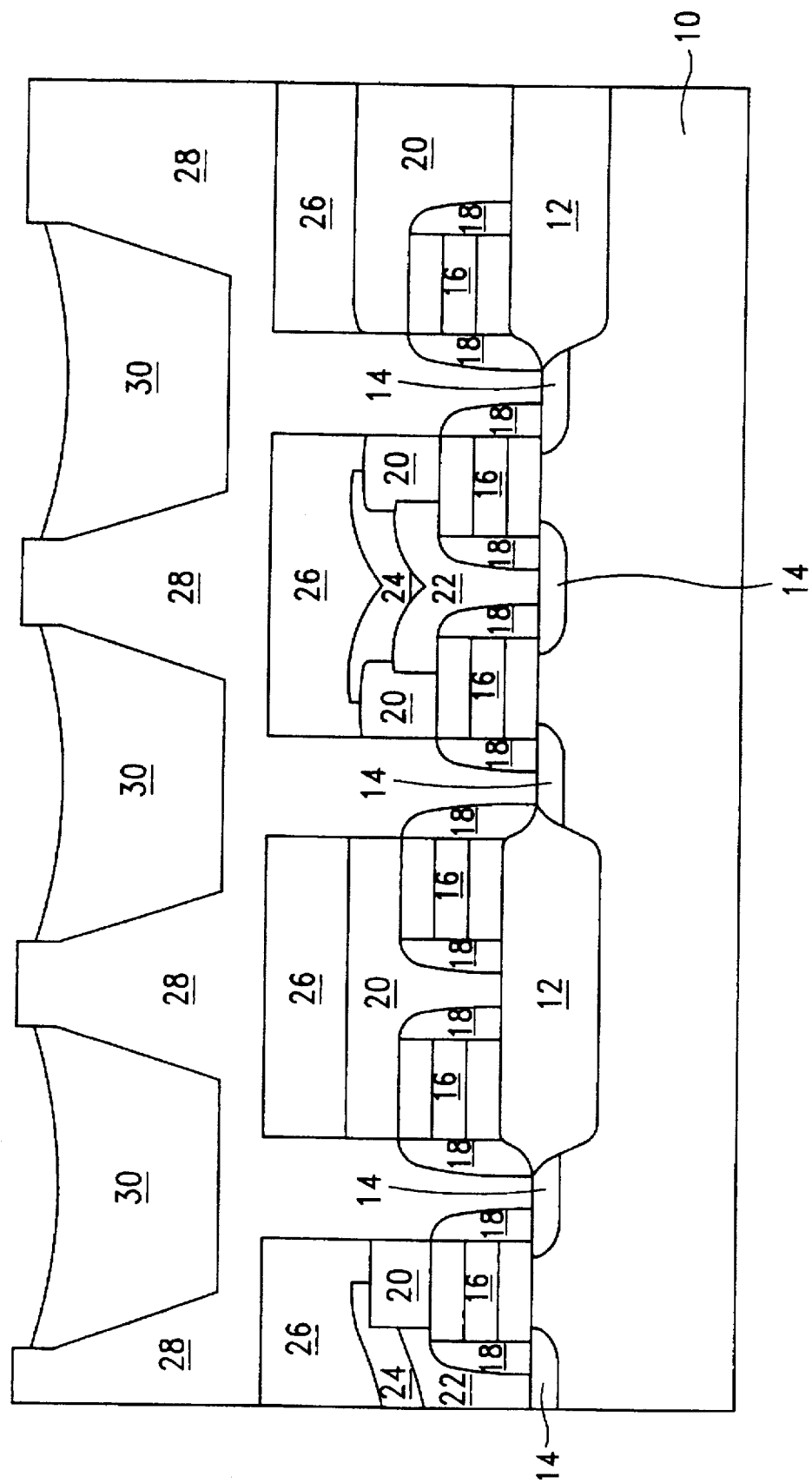
FIG. 5 is a cross-sectional view of a semiconductor wafer illustrative of forming a dielectric layer in trenches formed in the conductive layer, in accordance with the embodiment of FIG. 4.
Figure 6:
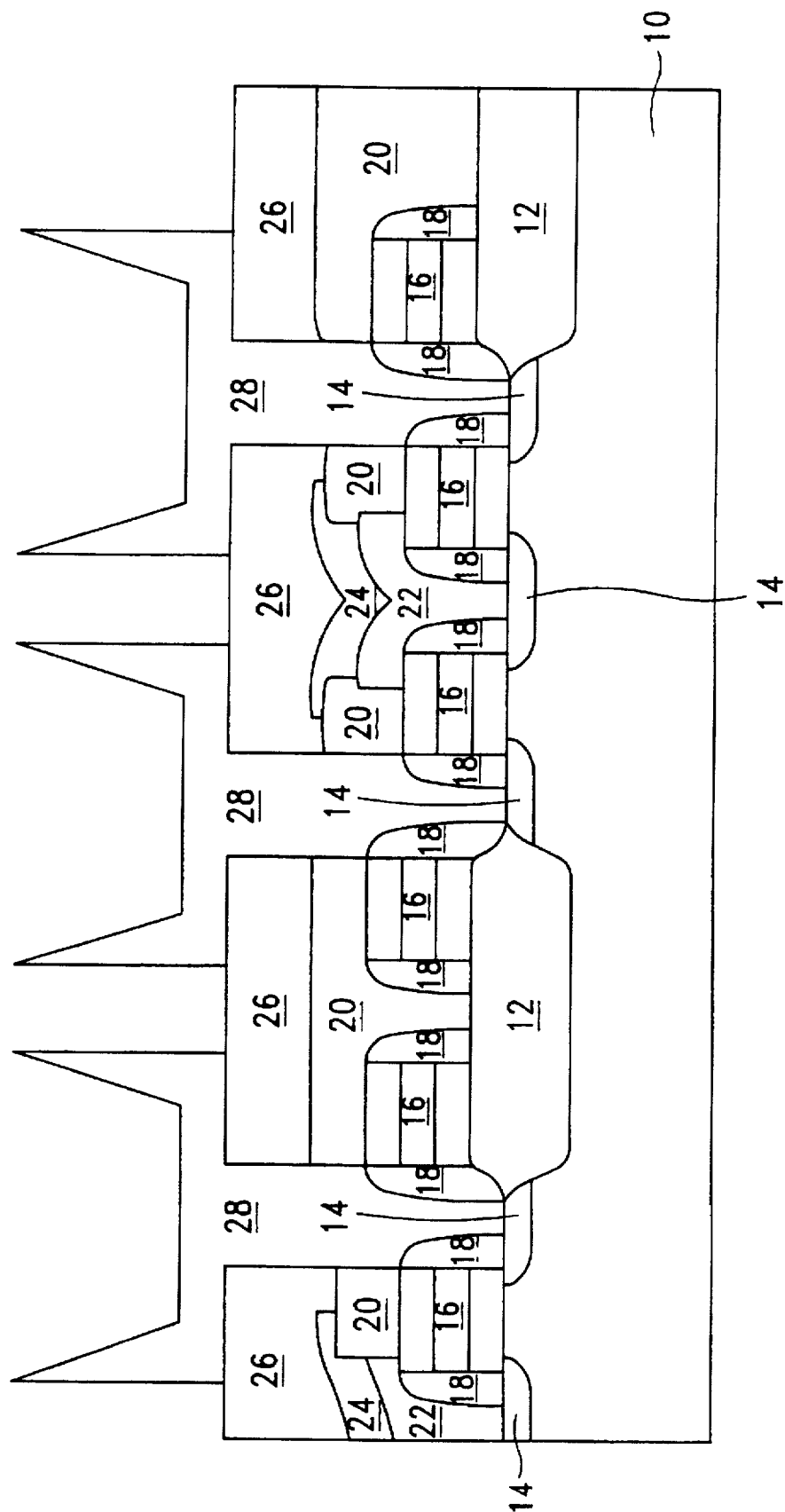
FIG. 6 is a cross-sectional view of a semiconductor wafer illustrative of forming storage nodes, in accordance with the embodiment of FIG. 5.

FIGS. 4–6 illustrate the fabrication of an alternative embodiment of the present invention. Referring to FIG. 4, FOX regions 12, MOSFETs, bit lines, word lines, dielectric layers 20 and 26 and contact holes are formed as described above in conjunction with FIG. 1. A second polysilicon layer 28 is then formed on the second dielectric layer 26 and in the contact holes using conventional LPCVD processes. The thickness of the second polysilicon layer 28 on the top surface of the second dielectric layer 28 is about 4000–10000 angstroms. The second polysilicon layer 28 doped with phosphorus dopants with a concentration of about $10^{20}$–$10^{21}$ ions/cm$^2$ to increase conductivity. Any suitable method may be used to doped the polysilicon such as, for example, in-situ doping.

Next, a photoresist layer (not shown) is formed and patterned on the second polysilicon layer 28 using conventional photolithographic processes. The patterned photoresist leaves uncovered a portion of the polysilicon layer 28 over each contact hole. In this embodiment, each uncovered portion is approximately 3000–10000 angstroms wide and centered over a contact hole. A two-step etching process is performed that is substantially similar to the etching process described above in conjunction with FIG. 1. The first step of the etching process is a direct etching process. The uncovered portions of the second polysilicon layer 28 are anisotropically etched using a standard time mode controlled process. The resulting approximately rectangular trenches are about 500–2000 angstroms deep.

The second step of this etching process is a tapered etching process. The tapered etching is achieved via reducing the etching rate by decreasing the gas flow of the $Cl_2$, HBr, and $O_2$ reaction gases. The tapered etching process is performed using the following etching conditions: a $Cl_2$ gas flow of about 420 sccm; a HBr gas flow of about 50 sccm; a $O_2$ gas flow of about 3 sccm; an excitation power of about 300 W; and a pressure of about 525 mtorr. The tapered etching process is performed using time mode control to form a tapered trench region in the second polysilicon layer 28 having a depth of about 2000–8000 angstroms. The resulting structure is shown in FIG. 4.

FIG. 5 illustrates a next stage of this embodiment of the process. A third dielectric layer 30 is formed on the polysilicon layer and completely filling the tapered trenches in the second polysilicon layer 28. The third dielectric layer 30 can be formed from any suitable dielectric material such as, for example, TEOS oxide, BPSG, or SOG, deposited using a standard CVD process. In this embodiment, the third dielectric layer 30 has a thickness of about 4000–10000 angstroms from the top surface of the of the polysilicon layer 28 between the tapered trenches. An etching process is then performed to remove the upper portion of the third dielectric layer 30 so that the top surface of the second polysilicon layer 28 is exposed. In this embodiment, dry etching process is used to etch back the third dielectric layer 30, leaving residual portions of the third dielectric layer in the tapered trenches.

Referring to FIG. 6, the second polysilicon layer 28 is anisotropically etched using the residual portions of the third dielectric layer 30 as an etching mask. This anisotropic etching process forms trenches through the second polysilicon layer 28 to separate the polysilicon storage nodes. As a result of this etching step, each of the storage nodes has approximately vertical exterior sidewalls and a tapered trench aligned with the contact hole. The tapered trench advantageously increases the surface area of the storage node, thereby increasing the storage capacitance of the storage node. In this embodiment, a standard dry etching process is performed, using the second dielectric layer 26 as an end-point of the etching process. Then, the residual portions of the third dielectric layer 30 are removed while leaving the polysilicon storage nodes intact. For example, if the dielectric layer 30 is made of BPSG, then a standard wet etching process having a selectivity ratio of about 500-to-one (polysilicon to BPSG ) can be used. The resulting structure is shown in FIG. 6.

Although specific embodiments, including the preferred embodiment, have been illustrated and described, it will be appreciated by those skilled in the art that various modifications may be made without departing from the spirit and scope of the present invention, which is intended to be limited solely by the appended claims.

The embodiments of the invention in which an exclusive property or privilege is claimed are defined as follows:

1. A method for forming an integrated circuit capacitor node on a semiconductor substrate, said semiconductor substrate having a first dielectric layer with a hole formed therein, said method comprising:

forming a first conductive layer over said semiconductor substrate, said first conductive layer filling said hole;

forming a mask layer over said first conductive layer;

removing portions of said first conductive layer not covered by said mask layer, wherein a tapered trench in said first conductive layer is formed;

removing said mask layer;

forming a second dielectric layer on said first conductive layer, said second dielectric layer filling said tapered trench;

removing portions of said first conductive layer not covered by said second dielectric layer; and removing said second dielectric layer, wherein a residual portion of said first conductive layer has a tapered sidewall, said residual portion of said first conductive layer implementing said capacitor node.

2. The method according to claim 1, wherein said first conductive layer comprises a doped polysilicon layer.

3. The method according to claim 2, wherein said first conductive layer is formed using a LPCVD method.

4. The method according to claim 2, wherein said first conductive layer has a thickness of about 4000–10000 angstroms.

5. The method according to claim 1, wherein removing portions of said first conductive layer comprises a first etching process and a second etching process.

6. The method according to claim 5, wherein said first etching process comprises an anisotropic etching process.

7. The method according to claim 6, wherein said first etching process uses a $Cl_2$ gas flow of about 70 sccm, a HBr gas flow of about 60 sccm, and a $O_2$ gas flow of about 6 sccm.

8. The method according to claim 6, wherein said first etching process comprises using an excitation power of about 550 W and a pressure of about 250 mtorr.

9. The method according to claim 6, wherein said first etching process comprises using time mode control to form a rectangularly shaped trench extending into but not through said first conductive layer.

10. The method according to claim 9, wherein said rectangularly shaped trench has a depth of about 500–2000 angstroms.

11. The method according to claim 5, wherein said second etching process comprises using a tapered etching method.

12. The method according to claim 11, wherein said tapered etching method forms a tapered trench from a bottom surface of said rectangular trench.

13. The method according to claim 11, wherein said tapered etching method comprises uses a $Cl_2$ gas flow of about 420 sccm, a HBr gas flow of about 50 sccm, and a $O_2$ gas flow of about 3 sccm.

14. The method according to claim 13, wherein said tapered etching method comprises using an excitation power of about 300 W and a pressure of about 525 mtorr.

15. The method according to claim 1, wherein said second dielectric layer has a thickness of about 4000–10000 angstroms over a top surface of said first conductive layer.

16. The method according to claim 1, wherein said second dielectric layer is formed of a material selected from a group consisting of TEOS oxide, BPSG, and SOG.

17. The method according to claim 1, wherein an upper portion of said second dielectric layer is removed leaving residual portions in said tapered trench.

18. The method according to claim 1, wherein forming a mask layer over said first conductive layer comprises forming said mask layer so that an etching mask covers a portion of said first conductive layer over said hole.

19. The method according to claim 18, wherein said tapered trench exposes a top surface of said first dielectric layer, said tapered trench forming a tapered exterior sidewall of said capacitor node.

20. The method according to claim 19, wherein removing portions of said first conductive layer not covered by said second dielectric layer forms a trench extending into but not through said capacitor node.

21. The method according to claim 1, wherein forming a mask layer over said first conductive layer comprises forming said mask layer so that said mask layer leaves uncovered a portion of said first conductive layer over said hole.

22. The method according to claim 21, wherein said tapered trench extends into but not through said first conductive layer.

23. The method according to claim 22, wherein said tapered trench is located in said capacitor node.

24. The method according to claim 22, wherein removing portions of said first conductive layer not covered by said second dielectric layer forms a trench extending through said first conductive layer and exposing a top surface of said first dielectric layer.

25. The method according to claim 24 wherein said trench extending through said first conductive layer forms an exterior side wall of said capacitor node.

* * * * *